United States Patent
Thompson

(10) Patent No.: US 11,009,350 B2
(45) Date of Patent: May 18, 2021

(54) PROOF MASS OFFSET COMPENSATION

(71) Applicant: InvenSense, Inc., San Jose, CA (US)

(72) Inventor: Matthew Thompson, Beaverton, OR (US)

(73) Assignee: InvenSense, Inc., San Jose, CA (US)

(*) Notice: Subject to any disclaimer, the term of this patent is extended or adjusted under 35 U.S.C. 154(b) by 286 days.

(21) Appl. No.: 15/868,746

(22) Filed: Jan. 11, 2018

(65) Prior Publication Data

US 2019/0212144 A1    Jul. 11, 2019

(51) Int. Cl.
| | |
|---|---|
| *G01C 19/56* | (2012.01) |
| *B81B 3/00* | (2006.01) |
| *G01C 19/5733* | (2012.01) |
| *G01P 15/125* | (2006.01) |
| *G01C 19/5719* | (2012.01) |
| *G01C 19/574* | (2012.01) |
| *G01C 19/5712* | (2012.01) |

(52) U.S. Cl.
CPC ............ *G01C 19/56* (2013.01); *B81B 3/0018* (2013.01); *G01C 19/574* (2013.01); *G01C 19/5712* (2013.01); *G01C 19/5719* (2013.01); *G01C 19/5733* (2013.01); *G01P 15/125* (2013.01); *B81B 2201/0228* (2013.01)

(58) Field of Classification Search
CPC ...... G01C 19/00; G01C 19/56; B81B 3/0018; B81B 2201/0228
USPC ............................. 73/504.12, 514.32, 514.01
See application file for complete search history.

(56) References Cited

U.S. PATENT DOCUMENTS

| | | | | |
|---|---|---|---|---|
| 6,257,057 | B1 * | 7/2001 | Hulsing, II | G01C 19/5719 73/504.04 |
| 7,258,011 | B2 * | 8/2007 | Nasiri | G01P 1/023 73/510 |
| 8,047,075 | B2 | 11/2011 | Nasiri | |
| 8,205,498 | B2 * | 6/2012 | Hsu | G01P 15/125 73/514.32 |
| 8,453,504 | B1 * | 6/2013 | Mao | G01C 19/574 73/504.14 |
| 8,534,127 | B2 * | 9/2013 | Seeger | G01C 19/5719 73/504.12 |
| 8,860,437 | B2 | 10/2014 | Santana | |
| 8,960,002 | B2 * | 2/2015 | Nasiri | G01P 15/0888 73/514.02 |

(Continued)

FOREIGN PATENT DOCUMENTS

WO    WO2016027800    12/2016

OTHER PUBLICATIONS

PCT International Search Report for International Application No. PCT/US2018/057236, dated Jan. 29, 2019 (13 Pages).

*Primary Examiner* — Octavia Hollington
(74) *Attorney, Agent, or Firm* — Haley Guiliano LLP; Joshua V. Van Hoven; Stefan D. Osterbur

(57) ABSTRACT

A microelectromechanical (MEMS) sensor comprises MEMS components located within a MEMS layer and located relative to one or more electrodes. A plurality of proof masses are located within the MEMS layer and are not electrically coupled to each other within the MEMS layer. Both the first proof mass and the second proof mass move relative to at least a common electrode of the one or more electrodes, such that the relative position of each of the proof masses relative to the electrode may be sensed. A sensed parameter may be determined based on the sensed relative positions.

23 Claims, 10 Drawing Sheets

(56) References Cited

U.S. PATENT DOCUMENTS

| | | | |
|---|---|---|---|
| 8,973,439 B1 | 3/2015 | Baldasarre | |
| 9,278,845 B2* | 3/2016 | Acar | G01C 19/5712 |
| 9,444,404 B2* | 9/2016 | Opris | G01P 9/04 |
| 10,371,715 B2* | 8/2019 | Baldasarre | |
| 2013/0001550 A1 | 1/2013 | Seeger | |
| 2013/0192369 A1 | 8/2013 | Acar | |
| 2014/0266170 A1* | 9/2014 | Seeger | G01P 15/08 |
| | | | 324/227 |
| 2014/0352431 A1* | 12/2014 | Leclerc | G01C 19/5712 |
| | | | 73/504.04 |
| 2015/0293141 A1* | 10/2015 | Wu | G01P 15/125 |
| | | | 73/504.12 |
| 2016/0214853 A1* | 7/2016 | Thompson | B81B 3/0016 |
| 2017/0168087 A1* | 6/2017 | Gafforelli | G01P 21/00 |

* cited by examiner

PROOF MASS OFFSET COMPENSATION

BACKGROUND

Numerous items such as smart phones, smart watches, tablets, automobiles, aerial drones, appliances, aircraft, exercise aids, and game controllers may utilize motion sensors during their operation. In many applications, various types of motion sensors such as accelerometers and gyroscopes may be analyzed independently or together to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

Motion sensors such as accelerometers and gyroscopes may be manufactured as microelectromechanical (MEMS) sensors that are fabricated using semiconductor manufacturing techniques. A MEMS sensor may include movable proof masses that can respond to forces such as linear acceleration (e.g., for MEMS accelerometers), angular velocity (e.g., for MEMS gyroscopes), and magnetic field. The operation of these forces on the movable proof masses may be measured based on the movement of the proof masses in response to the forces. In some implementations, this movement is measured based on distance between the movable proof masses and fixed electrodes, which form capacitors for sensing the movement.

SUMMARY OF THE INVENTION

In an embodiment of the present disclosure, a microelectromechanical (MEMS) sensor comprises a substrate, a first electrode located on the substrate, an anchor coupled to the substrate, a first proof mass coupled to the anchor, and a second proof mass coupled to the anchor, wherein the first and second proof masses are electrically separate. In an embodiment, the MEMS sensor further comprises a first sense element coupled to the first proof mass and the first electrode, and a second sense element coupled to the second proof mass and the first electrode.

In an embodiment of the present disclosure, a method for operating a microelectromechanical (MEMS) sensor comprises receiving, from a first sense element coupled to a first proof mass and a first electrode, a first sense signal, wherein the first electrode is located on a substrate, an anchor is coupled to the substrate, and the first proof mass coupled to the anchor. The method may further comprise receiving, from a second sense element coupled to a second proof mass and the first electrode, a second sense signal, wherein the second proof mass is coupled to the anchor, and wherein the first and second proof masses are electrically separate. The method may further comprise determining, by processing circuitry coupled to the first sense element and the second sense element, a measured signal that corresponds to a first external force based on the first sense signal and the second sense signal.

In an embodiment of the present disclosure, a microelectromechanical (MEMS) sensor comprises a first electrode having a first electrode plane, a first proof mass within a MEMS layer and having a first proof mass plane that overlaps at least a portion of the first electrode plane, a second proof mass within the MEMS layer and having a second proof mass plane that overlaps at least a portion of the first electrode plane, and wherein the first proof mass and the second proof mass are electrically separate within the MEMS layer. The MEMS sensor may further comprise processing circuitry coupled to the first electrode, first proof mass, and second proof mass, wherein the first proof mass moves in a first direction relative to the first electrode in response to a first external force, wherein the second proof mass is substantially stationary in response to the first external force, and wherein a signal that corresponds to the first external force is based on a first position of the first proof mass relative to the first electrode and the second position of the second proof mass relative to the first electrode.

BRIEF DESCRIPTION OF THE DRAWINGS

The above and other features of the present disclosure, its nature and various advantages will be more apparent upon consideration of the following detailed description, taken in conjunction with the accompanying drawings in which.

DETAILED DESCRIPTION

Figure 1:
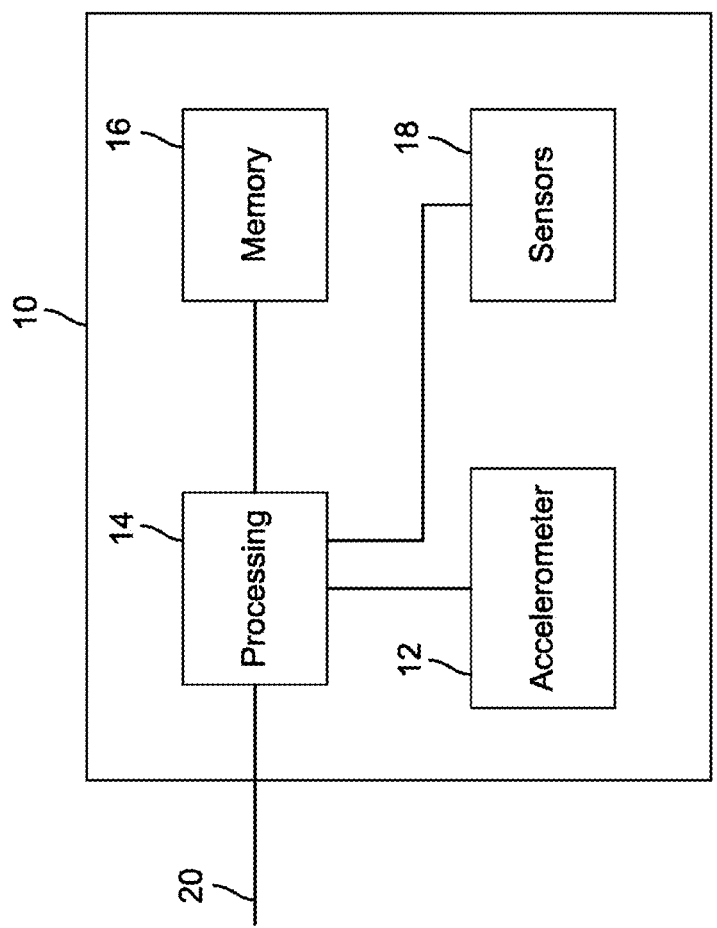
FIG. 1 shows an illustrative motion sensing system in accordance with an embodiment of the present disclosure.

In some embodiments of the present disclosure, a MEMS device may include structures that are fabricated using semiconductor processes and that include internal components for measuring external forces such linear acceleration, magnetic field, acoustic pressure, barometric ambient pressure, or Coriolis force (e.g., as a result of an angular velocity experienced by the MEMS device). Such internal components may include mechanical and/or electrical components that are designed to respond to the external force being measured, for example, by experiencing a movement in response to the external force. In some embodiments, the components of the MEMS device may be configured in a manner to facilitate movement in response to the external force or forces being measured and to limit movement in other directions and in response to other types of forces.

An exemplary MEMS accelerometer in accordance with the present disclosure may include a plurality of proof masses that are coupled to one or more anchors and one or more coupling components (e.g., springs, bars, lever arms) in a manner that permits the MEMS sensor to measure linear acceleration in a particular direction. In some embodiments, the plurality of proof masses may be suspended and coupled in a manner such that the proof masses move in response to linear acceleration in the direction, such as in a direction along or about an axis. The movement of the masses relative to another surface (e.g., a fixed electrode) in the sense direction in response to linear acceleration, which may be measured using techniques such as a variable capacitor, a piezo-resistive sensor, a piezo-electrical sensor, an optical sensor, or a magnetic sensor. In some embodiments, this measured movement may be sensed and scaled to make determinations such as a linear acceleration.

An exemplary MEMS device may be constructed of several layers such as a substrate (e.g., CMOS) layer, a MEMS layer, and a cap layer. The MEMS layer may include the movable components such as the plurality of movable proof masses. In an exemplary embodiment of capacitive sensing of linear acceleration, in-plane sensing along an x-axis or y-axis may be performed utilizing fixed electrodes positioned relative to proof masses, which in some embodiments, may extend into the MEMS layer, such that movements of the proof masses within the MEMS layer may be measured. In an exemplary embodiment of out-of-plane sensing, a linear acceleration such as a z-axis acceleration may cause one or more proof mases to move out of the MEMS device plane, for example, by rotating about an axis.

In some instances, a MEMS sensor may be subject to external stresses other than the force being measured as a result of a variety of causes such as manufacturing tolerances, stresses imposed on the sensor during assembly with other components, changes such as wear that occur over time during operation, and changes that occur due to environmental and operating conditions (e.g., temperature, location relative to measured systems, etc.). Examples of underlying causes of such undesired external forces may comprise thermal expansion, fabrication loading, shock, impact, soldering, or hygroscopic swelling. These forces may shift portions of the MEMS sensor relative to other portions, for example by causing portions of the MEMS layer to shift relative to other layers (e.g., a cap or substrate layers) or to fixed components with in the MEMS layer. This may modify the relative distance of components that are used to measure the desired parameter, such as the relative distance between one or more proof masses relative to one or more electrodes.

In an exemplary embodiment in accordance with the present disclosure, a first proof mass of a plurality of proof masses may be suspended from the one or more anchors above a fixed electrode (e.g., on a substrate plane below the first proof mass) in a manner such that it is designed to move in response to the force being measured (e.g., a proof mass designed to rotate out-of-plane about an axis in response to a linear acceleration along the z-axis) and relative to the fixed electrode to cause a change in a capacitance between the proof mass and the fixed electrode. A second proof mass (e.g., a paddle mass) may be coupled to the one or more anchors in a rigid manner, such that it shifts in response to undesired forces such as an external stress (e.g., movement of the MEMS layer relative to a substrate plane where the fixed electrode is located). The second proof mass may also be located above the fixed electrode (e.g., at least partially surrounded or interdigitated by the first electrode). The first proof mass and the second proof mass may not be electrically coupled within the MEMS layer. Sensed signals (e.g., changes of capacitance) for the capacitor associated with the first proof mass and the fixed electrode (e.g., a sense capacitor) and for the capacitor associated with the second proof mass and the fixed electrode (e.g., an offset capacitor) may be used to accurately determine the desired measured value (e.g., z-axis linear acceleration) in spite of the effects of an external stress on the sensor (e.g., causing an out-of-plane shift of the MEMS layer relative to the substrate layer).

Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS inertial sensor 12 (e.g., a single or multi-axis accelerometer, a single or multi-axis gyroscope, or combination thereof) and supporting circuitry, such as processing circuitry 14 and memory 16. In some embodiments, one or more additional sensors 18 (e.g., additional MEMS gyroscopes, MEMS accelerometers, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of an inertial sensor 12 or other sensor 18, or on an adjacent portion of a chip to the inertial sensor 12 or other sensor 18) to control the operation of the inertial sensor 12 or other sensor 18 and perform aspects of processing for the inertial sensor 12 or other sensor 18. In some embodiments, the inertial sensor 12 and other sensors 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the inertial sensor 12 by interacting with the hardware control logic, and process signals received from inertial sensor 12. The microprocessor may interact with other sensors in a similar manner.

Although in some embodiments (not depicted in FIG. 1), the inertial sensor 12 or other sensors 18 may communicate directly with external circuitry (e.g., via a serial bus or direct connection to sensor outputs and control inputs), in an embodiment the processing circuitry 14 may process data received from the inertial sensor 12 and other sensors 18 and communicate with external components via a communication interface 20 (e.g., a SPI or I2C bus, or in automotive applications, a controller area network (CAN) or Local Interconnect Network (LIN) bus). The processing circuitry 14 may convert signals received from the inertial sensor 12 and other sensors 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place and quantify or otherwise analyze that activity.

In some embodiments, certain types of information may be determined based on data from multiple inertial sensors 12 and sensors 18, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

An exemplary MEMS inertial sensor (e.g., inertial sensor 12) may include one or more movable proof masses that are configured in a manner that permits the MEMS inertial sensor (e.g., a MEMS accelerometer or MEMS gyroscope) to measure a desired force (e.g., linear acceleration or angular velocity) along an axis. In some embodiments, the one or more movable proof masses may be suspended from anchors. At least some of the proof masses may be arranged in a manner such that they move in response to measured force. The movement of the proof masses relative to a fixed surface (e.g., a fixed sense electrode extending in to the MEMS layer or located parallel to the movable mass on the substrate) in response to the measured force is measured and scaled to determine the desired inertial parameter.

Measurement of an inertial force may be based on designed parameters regarding the initial position of the proof masses relative to the fixed electrodes (e.g., in the absence of an inertial force) as well as the expected relative movement of the proof masses relative to the fixed electrodes in response to inertial forces. In some embodiments, various components that suspend the proof masses within the MEMS layer may be designed to facilitate motion in a particular direction and resist motion in other directions (e.g., with springs that are compliant in a particular direction rigid in the other directions, or levers that support movement in the particular direction and resist movement in the other directions). In this manner, despite the presence of inertial and other forces in multiple directions (e.g., x-direction, y-direction, z-direction) and due to multiple causes (e.g., linear acceleration, angular velocity, etc.), the proof masses of a MEMS sensor may primarily respond only to certain forces in the direction that is desired for measurement. For example, in a direction that is desired for measurement, the movable proof masses may be suspended such that the response to a particular force in the direction to be measured is larger than the response to a force of the same magnitude in other directions. This ratio of the desired response to the undesired to the same magnitude force may be multiple times greater, and in some designs, well over an order of magnitude greater.

Figure 2:
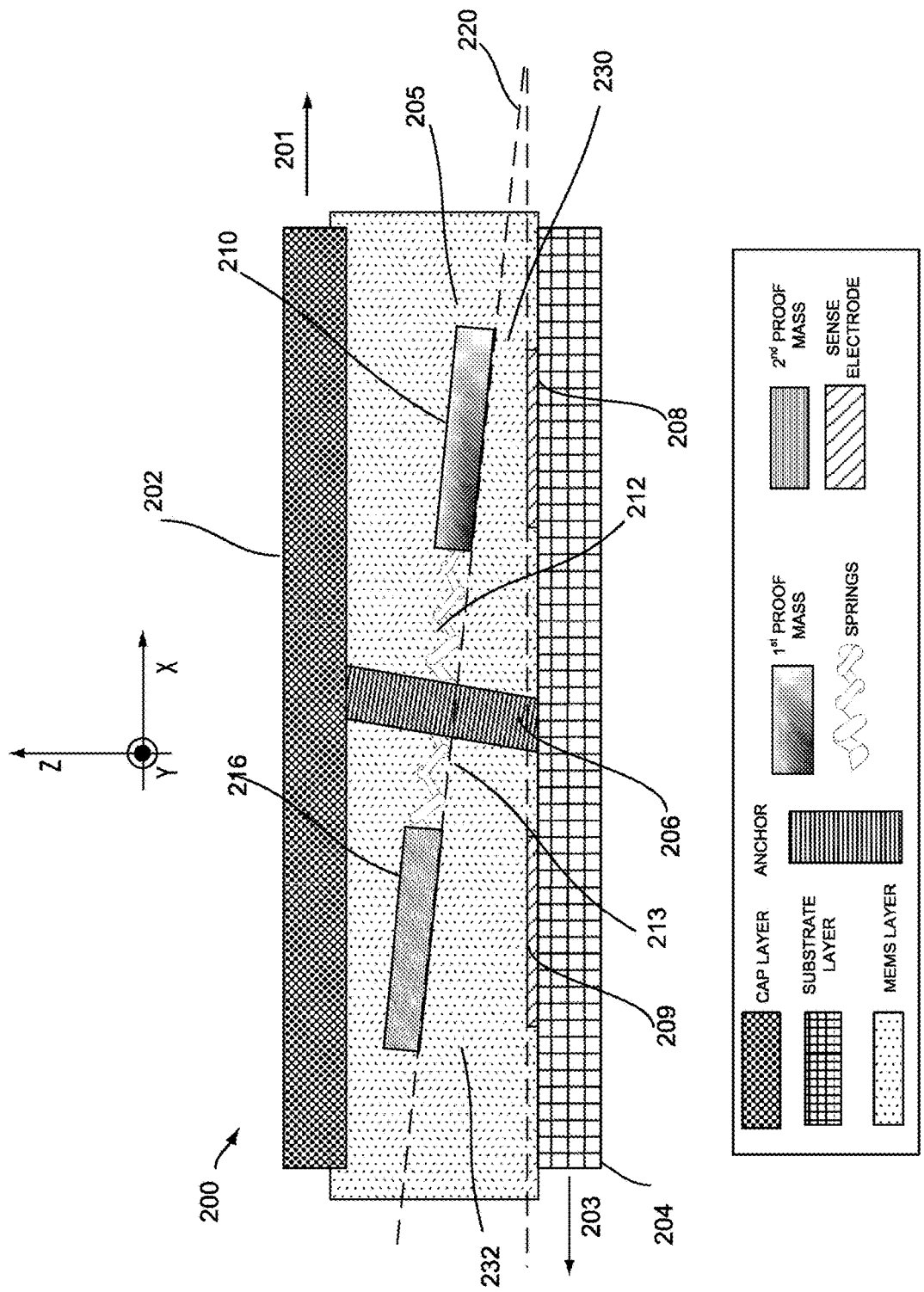
FIG. 2 shows an illustrative MEMS sensor experiencing an out-of-plane force in accordance with some embodiments of the present disclosure.

FIG. 2 shows an illustrative MEMS sensor 200 experiencing an out-of-plane force in accordance with some embodiments of the present disclosure. In the exemplary embodiment of FIG. 2, one or more external forces cause components within a MEMS layer to move out-of-plane, e.g., relative to other layers of the MEMS device. Although particular components having a particular configuration are depicted in FIG. 2, it will be understood that other layer types, anchor configurations, MEMS senor types, and MEMS layer components may experience a variety of external forces that cause out-of-plane movement of at least a portion of a MEMS layer relative to other layers in accordance with the present disclosure.

In the exemplary embodiment of FIG. 2, the external force applied may be a shearing force that causes opposing movement of a cap layer 202 in a positive x-direction and of a substrate layer 204 along a negative x-direction, as indicated by shearing forces 201 and 202. Although a shearing force imparted upon the cap layer 202 and substrate layer 204 in the exemplary embodiment of FIG. 2, it will be understood that a variety of forces may be imparted on different layers and/or portions of the sensor 200. Exemplary forces (e.g., compressive, shearing, tension, bending and torsional) and combinations thereof may be imparted on portions of the sensor 200 (e.g., cap layer 202, substrate layer 204, and MEMS layer 205) from a variety of causes (e.g., thermal expansion, fabrication loading, shock, impact, soldering, or hygroscopic swell) that occur in a variety of situations during the fabrication and lifetime of use of the sensor 200 (manufacturing tolerances, stresses imposed on the sensor during assembly with other components, changes such as wear that occur over time during operation, and changes that occur due to environmental and operating conditions (e.g., temperature, location relative to measured systems, etc.)).

In an embodiment of the present disclosure, MEMS sensor 200 may include a cap layer 202, a substrate layer 204 having fixed electrodes 208 and 209, and a MEMS layer 205 that is at least partially bonded to the cap layer 202 and substrate layer 204 (not depicted) to form a cavity. Within the MEMS layer 205 of the cavity are a variety of components that are movable in response to forces, which may be suspended within the MEMS layer 205 by components such as springs, bars, and levers form a suspended spring-mass system. In the exemplary embodiment of FIG. 2, the MEMS layer 205 includes at least first proof mass 210, springs 212-213, and second proof mass 216.

The suspended spring-mass system is coupled to an anchoring component 206, which in the exemplary embodiment if FIG. 2 is coupled to each of the cap layer 202 and substrate layer 204. The suspended spring-mass system includes a first proof mass 210 that is suspended from the anchoring component 206 by a first spring 212 and a second proof mass 216 that is suspended from the anchoring component 206 by a second spring 213. A first electrode 208 is located on substrate layer 204 below first proof mass 210, forming a first capacitor 230. A second electrode 209 is located on substrate layer 204 below second proof mass 216, forming a second capacitor 232.

First proof mass 210 may be suspended by first spring 212 in a manner such that it moves in response to an inertial force to be measured (e.g., acceleration) along a sense axis to be measured (e.g., the z-axis) such that at least a portion of the first proof mass 210 moves relative the first electrode 208, modifying a value of capacitor 230. Second proof mass 216 may be suspended by second spring 213 in a manner such that it moves in response to a second force to be measured (e.g., an offset due to movement of the MEMS layer due to an undesired force such as shear force 201/203) along the sense axis to be measured (e.g., the z-axis) such that at least a portion of the second proof mass 216 moves relative the second electrode 209, modifying a value of capacitor 232. In an exemplary embodiment, the second proof mass 216 may be substantially fixed in response to the inertial force to be measured (e.g., a paddle-type proof mass).

Although the electrodes 208/209 are depicted as forming capacitors 230/232, it will be understood that can be any suitable sensing mechanisms such as capacitors, piezo-resistive sensing, piezo-electrical sensing, optical sensing, magnetic sensing, or any other suitable sensing techniques may be utilized to determine distance between portions of the MEMS layer 205 and substrate layer 204. Thus, it will be understood that while an exemplary MEMS sensor 200 is depicted as including particular components in FIG. 2, the present disclosure may be implemented for a variety of suitable of sensor designs including any suitable number and configuration of proof masses, spring-mass system, anchors, paddles, fixed electrodes, and other suitable components that enable the sensing of a desired parameter (e.g., linear acceleration).

In an exemplary embodiment such as that depicted in FIG. 2, each of the components within the MEMS layer 205 may be conductive, such that a voltage applied to any one component will also be applied to any other components for which a circuit path exists. One or more voltages may also be applied to first electrode 208 and/or second electrode 209, e.g., by circuitry in substrate 204. In different embodiments, one portion (e.g., a proof mass or an electrode) of each capacitor (e.g., first capacitor 230 and second capacitor 232) may be driven with a voltage while a second portion of each capacitor (e.g., the other of a proof mass or electrode) may be utilized for sensing the capacitance of each capacitor.

MEMS sensor 200 may include processing circuitry (not shown) coupled to a portion (e.g., a proof mass or an electrode) of the first capacitor 230 and a portion (e.g., a proof mass or an electrode) of the second capacitor 232 to determine a sensed inertial parameter such as linear acceleration along an axis (e.g., a z-axis linear acceleration). A signal representative of the capacitance of each of the capacitors may be provided from the proof mass or electrode to sensing circuitry such as capacitance-to-voltage (C2V) converters and analog and digital sensing and conversion circuitry. The sense axis is normal to the first electrode 208 such that the movement of the proof mass 210 in response to the inertial force comprises an out-of-plane movement outside of the MEMS layer 214. The out-of-plane movement of the first proof mass 210 (e.g., further in the z-direction to that depicted in FIG. 2) changes a value of the first capacitor 230 while a value of the second capacitor 232 is substantially constant in response to the measured inertial force.

In this manner, the second proof mass may provide offset compensation based to compensate for the movement caused by the undesired force, e.g., the shear force 201/203 of FIG. 2. The undesired force results in the components of the MEMS layer 205 having an angle 220 with respect to the substrate layer 202. This force may be considered undesired because under normal operation it may be expected that the MEMS layer 205 is parallel to the substrate layer 202, and a variety of factors used to determine the desired force (e.g., acceleration) such as analog and digital scaling factors and gain values may be based on this expected relative location.

In the exemplary embodiment of FIG. 2, the second proof mass 216 is located relative to first proof mass 212 such that it provides compensation for movement in response to an undesired force. For example, the shearing force 201/203 causes the MEMS layer to be at an angle 220 with respect to the substrate layer 204, which in turn causes the first electrode 210 to be located closer relative to the first electrode 208 than a designed location. Thus, when the first proof mass 210 moves relative to the first electrode 208 in response to the measured inertial force, the resulting capacitance value may be different than an expected value for a particular inertial force. Second proof mass 216 may be located such that it provides offset compensation for first proof mass 210, e.g., such that when first proof mass 210 moves closer to the substrate layer 202 in response to the undesired force, second proof mass 216 moves farther away from the substrate layer 202. A value of capacitor 232 may decrease. Because second proof mass 216 does not substantially respond to the measured inertial force, the value of capacitor 232 may be representative of the offset of MEMS layer 205 (e.g., angle 220), and may be used by the processing circuitry to compensate the output of capacitor 230, to remove the effects of the MEMS layer 205 offset.

In an exemplary embodiment, the proof masses 210 and 216 may be substantially larger than the electrodes 208 and 209, such that any misalignment (e.g., along or about any combination of the x-axis, y-axis, or z-axis) of the MEMS layer 205 (e.g., of proof masses 210 and 216) relative to the substrate (e.g., electrodes 208 and 209) may result in a substantially similar overlap (e.g., within the x-y plane) of the proof masses with respect to the electrodes. In other embodiments, the electrodes may be substantially larger than the proof masses in a similar manner.

Figure 3:
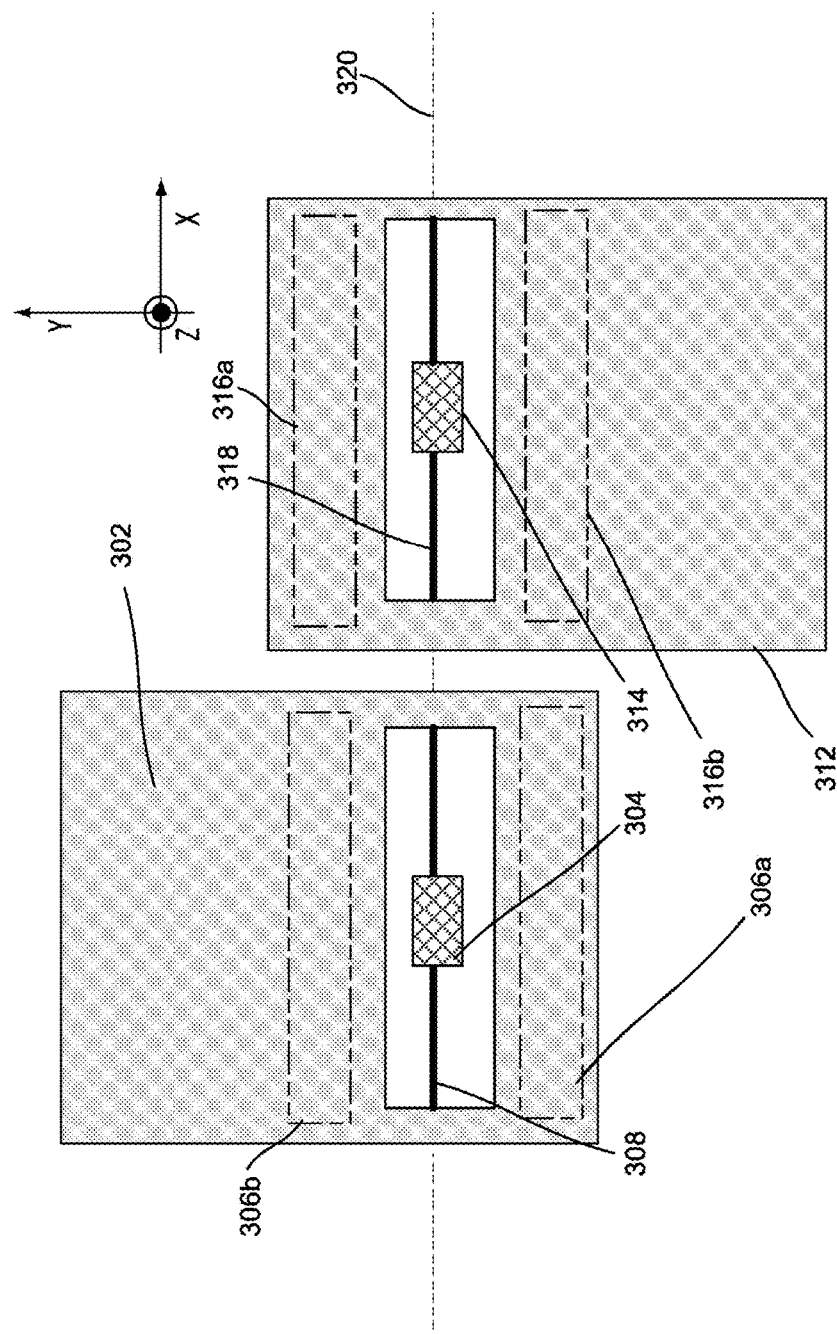
FIG. 3 shows an exemplary sensor for sensing out-of-plane motion with two proof masses in accordance with some embodiments of the present disclosure.

FIG. 3 shows an exemplary sensor for sensing out-of-plane motion with multiple proof masses in accordance with some embodiments of the present disclosure. Although a multiple proof mass out-of-plane sensor may have multiple configurations and numbers of proof masses, in the exemplary embodiment of FIG. 3 a portion of a MEMS sensor is depicted within the x-y plane of the MEMS layer, including two proof masses that respond in anti-phase to a linear acceleration along the Z-axis.

In an embodiment, the sensor of FIG. 3 may include a first proof mass 302 suspended from a first anchor 304 via first springs 308, as well as a second proof mass 312 suspended from a second anchor 314 via second springs 318. First electrodes 306a/b may be located below and parallel to respective portions of first proof mass 302 to form a first capacitor, while second electrodes 316a/b may be located below and parallel to respective portion of second proof mass 312 to form a second electrode. One of first proof mass 302 or first electrodes 306a/b may be provided with a driving voltage, while the other may be utilized to sense the first capacitance. One of second proof mass 312 or second electrodes 316a/b may be provided with a driving voltage, while the other may be utilized to sense the second capacitance.

Each of the first proof mass 302 and second proof mass 312 may be suspended in a manner to rotate about a rotational axis 320 in response to a linear acceleration along the z-axis. Proof masses 302 and 312 may have an identical size and shape, and may overlap respective electrodes 306 and 316 in an identical manner. In response to a linear acceleration in the positive z-direction, proof mass 302 may rotate about rotational axis 320 in a counterclockwise direction while proof mass 312 may rotate about rotational axis 320 in a clockwise direction. In response to a linear acceleration in the negative z-direction, proof mass 302 may rotate about rotational axis 320 in a clockwise direction while proof mass 312 may rotate about rotational axis 320 in a counterclockwise direction. Linear acceleration may be sensed based on the changes in the capacitances of the first and second capacitors. In the instance with in-plane and/or out-of-plane misalignment of the proof masses 302 and 312, the multiple proof masses may compensate for such misalignment. Because the proof masses 302 and 312 are within the same MEMS layer, they may experience a similar misalignment. Thus, any capacitor errors introduced by misalignment may be compensated based on countervailing changes in the other capacitor.

Figure 4:
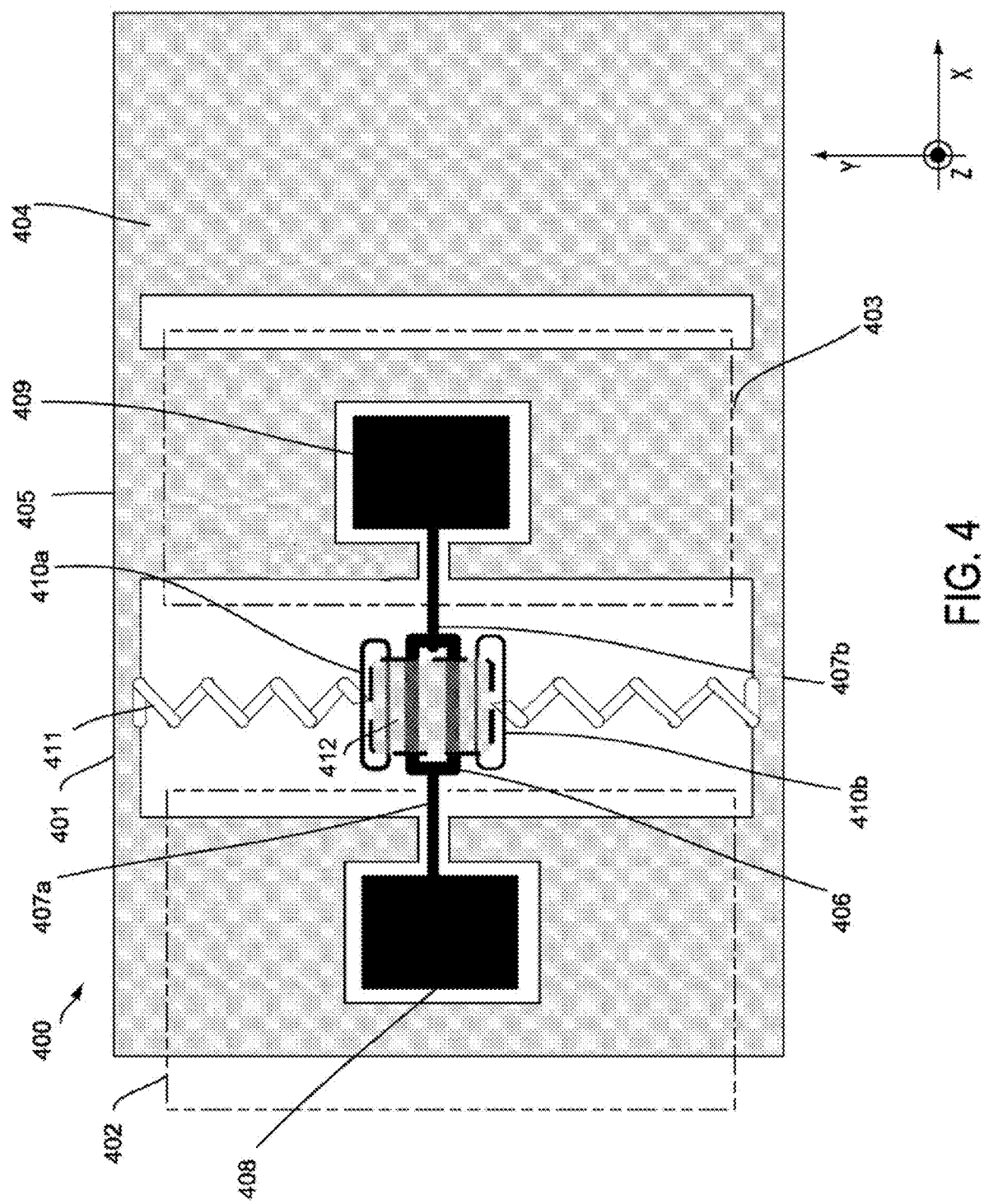
FIG. 4 shows an illustrative MEMS sensor including proof masses including shared electrodes in accordance with some embodiments of the present disclosure.

FIG. 4 shows an illustrative MEMS sensor including proof masses including shared electrodes in accordance with some embodiments of the present disclosure. Although a MEMS sensor including proof masses including shared electrodes may have multiple configurations, numbers and combinations of proof masses, and numbers and configurations of electrodes, in the exemplary embodiment of FIG. 4 two separate potentials may be provided to two separate proof mass systems of a MEMS accelerometer, each of which of has a portion which is suspended over each of one substrate electrodes. In the exemplary embodiment of FIG. 4, a portion of a MEMS sensor is depicted within the x-y plane of the MEMS layer. In the exemplary embodiment of FIG. 4, a MEMS sensor 400 may include first proof mass system 401, electrodes 402 and 403, proof mass 404, second proof mass system 405, anchor 406, beams 407, proof mass 408, proof mass 409, anchor 410a, anchor 410b, springs 411, and common anchor 412.

First proof mass system 401 may include anchors 410a and 410b which are fixedly coupled to one or both of a cap layer and a substrate layer. Anchors 410a and 410b are electrically coupled via at least the other components of first proof mass system 401 and have the same potential (e.g., a first potential). Springs 411 may be coupled to each of anchors 410a and 410b respectively, and also to proof mass 404. Spring portions 411 may be substantially torsionally compliant, such that the springs 411 permit a rotation about the y-axis defined by the length of the springs in response to a linear acceleration that is desired to be sensed. Proof mass 404 may be suspended within the MEMS layer by the springs 411 and anchors 410a and 410b. The proof mass 404 is at the first potential based on the electrical connection to the anchors 410a and 410b via springs 411.

A first portion of proof mass 404 (e.g., a far left-side portion in FIG. 4) is suspended over electrode 402 to form a first capacitor. A second portion of proof mass 404 (e.g., a middle portion in FIG. 4) is suspended over electrode 403 to form a second capacitor. In response to a linear acceleration in the positive z-direction, proof mass 404 may rotate about springs 411 such that proof mass 404 moves closer to electrode 403 (increasing the capacitance of the second capacitor) and farther from electrode 402 (decreasing the capacitance of the second capacitor). In response to a linear acceleration in the positive z-direction, proof mass 404 may rotate about springs 411 such that proof mass 404 moves closer to electrode 402 (increasing the capacitance of the first capacitor) and farther from electrode 403 (increasing the capacitance of the second capacitor). Linear acceleration may be sensed based on the changes in the capacitances of the first and second capacitor.

Second proof mass system 405 may include anchor 406 is fixedly coupled to one or both of a cap layer and a substrate layer. Anchor 406 is electrically coupled via to the other components of second proof mass system 405 such that all components of second proof mass system 405 have the same potential (e.g., a second potential). As depicted in FIG. 4, first proof mass system 401 and second proof mass system may not be electrically coupled within the MEMS layer, such that the respective proof mass systems are electrically separate. In some embodiments, the first proof mass system 401 and second proof mass system 405 may also be electrically separate (e.g., permanently or selectively) within the MEMS sensor. In this manner, the first proof mass system 401 and second proof mass system 405 may have different potentials in some embodiments.

Beam portions 407a/b may couple anchor 406 to proof mass 408 and proof mass 409, respectively. Beam portions 407a/b may be substantially rigid, such that proof masses 408 and 409 do not have substantial movement in response to forces such as inertial forces. In some embodiments, such proof masses that do not have a substantial response to inertial forces such as the inertial force to be sensed may be referred to as paddles or paddle masses (e.g., paddle masses 408 and 409). Proof masses 408 and 409 are suspended within the MEMS layer by the beam portions 407a/b. The proof masses 408 and 409 are at the second potential based on the electrical connection to the anchor 406. In the exemplary embodiment of FIG. 4, the proof masses 408 and 409 are surrounded by the proof mass 404 on at least three sides and partially surrounded on the fourth side.

Proof mass 408 is suspended over electrode 402 to form a third capacitor and proof mass 409 is suspended over electrode 403 to form a fourth capacitor. Because the proof mass 408 and 409 to not move in response to the inertial force to be sensed by the MEMS sensor, the location of the proof mass 408 relative to the electrode 402 and the location of proof mass 409 relative to electrode 403 are based on the position of the MEMS layer relative to the substrate. Thus, the values of the third capacitor and fourth capacitor may be representative of out-of-plane misalignment of the MEMS layer as described herein, which also includes any alignment of the first proof mass portion 401. The values of the third capacitor and the fourth capacitor may be utilized to compensate for the out-of-plane offset of the MEMS layer relative to the substrate.

In an exemplary embodiment, an overlap between the proof mass 408 and electrode 402 may be significantly less than an overlap between the proof mass 404 and electrode 402, while an overlap between the proof mass 409 and electrode 403 may be significantly less than an overlap between the proof mass 404 and electrode 403, although in other embodiments the relative sizes may be switched or otherwise modified. In an exemplary embodiment, the overlap of the proof mass 404 with the electrodes 402 and 403 may be at least twice as large as the overlap of the proof masses 408 and 409 with the electrodes 402 and 403, while in other embodiments the relative overlap may be greater or lesser (e.g., an order of magnitude).

In an embodiment, a common anchor 412 may be coupled to each of anchor 406, anchor 410a, and anchor 410b. In an exemplary embodiment, the common anchor 412 may extend from a cap layer and form a bond with each of the anchors 406, 410a, and 410b. Although different types of bonds may be performed in different embodiments, in an exemplary embodiment the bond between common anchor 412 and the other anchors may be such that anchor 406 remains electrically separate from anchor 410a and 410b (e.g., based on one or more bonds of limited conductive properties).

Figure 5:
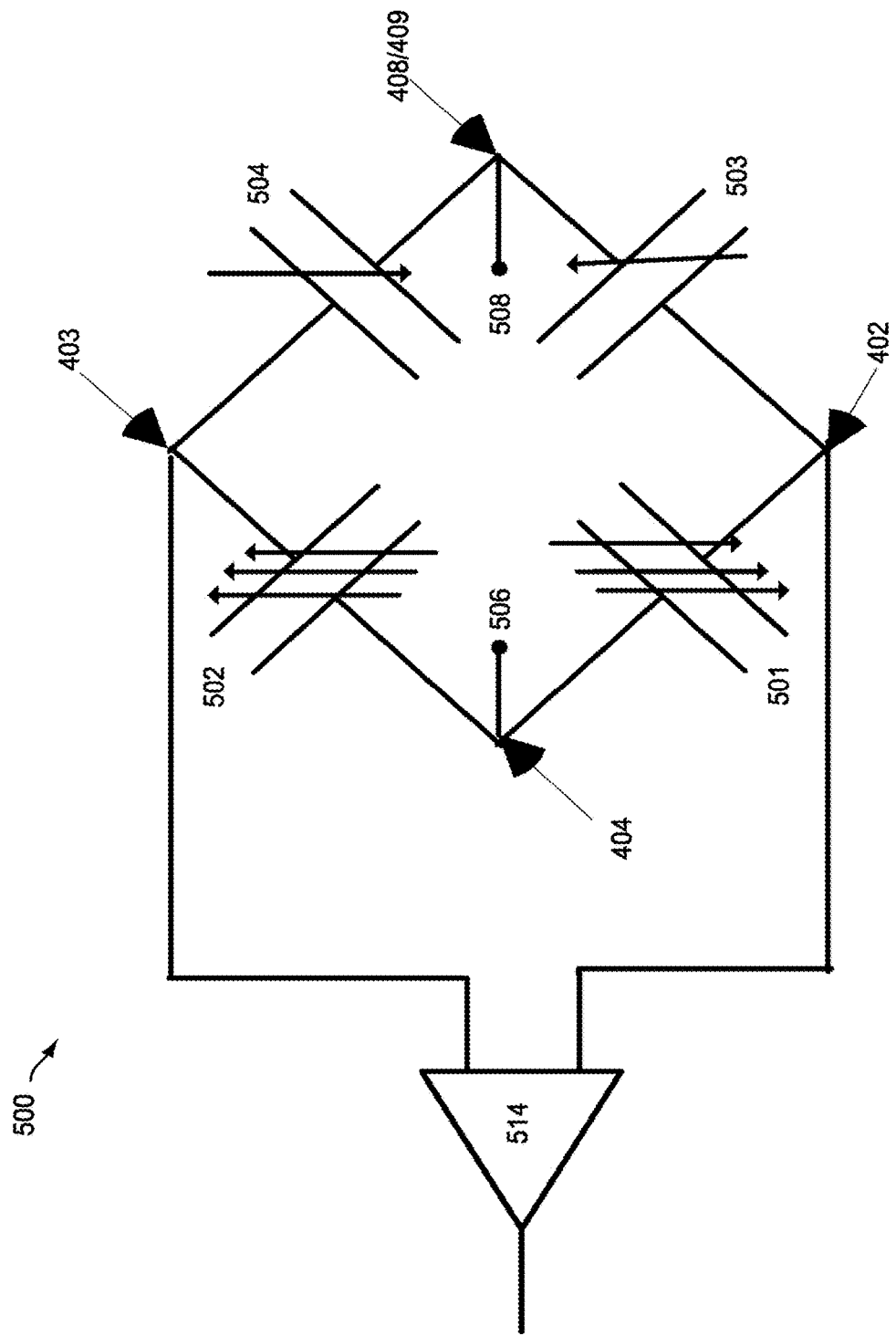
FIG. 5 shows an illustrative configuration of a proof mass bridge in accordance with some embodiments of the present disclosure.

FIG. 5 shows an illustrative configuration of a proof mass bridge 500 in accordance with some embodiments of the present disclosure. Although a proof mass bridge may be implemented with any suitable MEMS sensor, in the exemplary embodiment of FIG. 5 the proof mass bridge 500 may be a Full Wheatstone bridge and may be implemented with the exemplary MEMS linear accelerometer of FIG. 4. In an exemplary embodiment, proof mass bridge 500 includes first capacitor 501 (e.g., based on the capacitance between proof mass 404 and electrode 402), second capacitor 502 (e.g., based on the capacitance between proof mass 404 and electrode 403), third capacitor 503 (e.g., based on the capacitance between proof mass 408 and electrode 402), fourth capacitor 504 (e.g., based on the capacitance between proof mass 409 and electrode 403), drive source 506, drive source 508, and C2V converter 514.

In one embodiment, drive source 506 provides a first drive signal (e.g., having a first potential) to proof mass 404 (e.g., via anchors 410a and 410b and spring 411) and drive source 508 provides a second drive signal (e.g., having a second potential) to proof masses 408 and 409 (e.g., via anchor 406 and beam 407). Electrode 402 functions as a first output node of the Full Wheatstone bridge and has an overall capacitance that is based on both first capacitor 501 (e.g., due to any out-of-plane misalignment of the MEMS plane and also due to movement of proof mass 404 due to a measured linear acceleration) and third capacitor 503 (e.g., due to any out-of-plane misalignment of the MEMS plane and without substantial movement due to a measured linear acceleration). Electrode 403 functions as a second output node of the Full Wheatstone bridge and has an overall capacitance that is based on both second capacitor 502 (e.g., due to any out-of-plane misalignment of the MEMS plane and also due to movement of proof mass 404 due to a measured linear acceleration) and fourth capacitor 504 (e.g., due to any out-of-plane misalignment of the MEMS plane and without substantial movement due to a measured linear acceleration). The capacitances from electrodes 402 and 403 are provided to differential inputs of C2V converter 514, which outputs a signal that is representative of the measured linear acceleration, with compensation for any out-of-plane misalignment of the MEMS layer provided based on the proof masses 408 and 409.

FIG. 5 depicts an exemplary positive z-axis acceleration with an out-of-plane misalignment of the MEMS layer that causes the MEMS layer to move closer to electrode 402 and farther from 403 (e.g., as compared to a MEMS layer that is parallel to the substrate). The positive z-axis acceleration causes the proof mass 404 to rotate such that the proof mass 404 moves closer to electrode 403 and farther from electrode 402. The out-of-plane misalignment causes proof mass 408 to be situated closer than parallel with electrode 402 and causes proof mass 409 to be situated farther than parallel with electrode 403.

Figure 6:
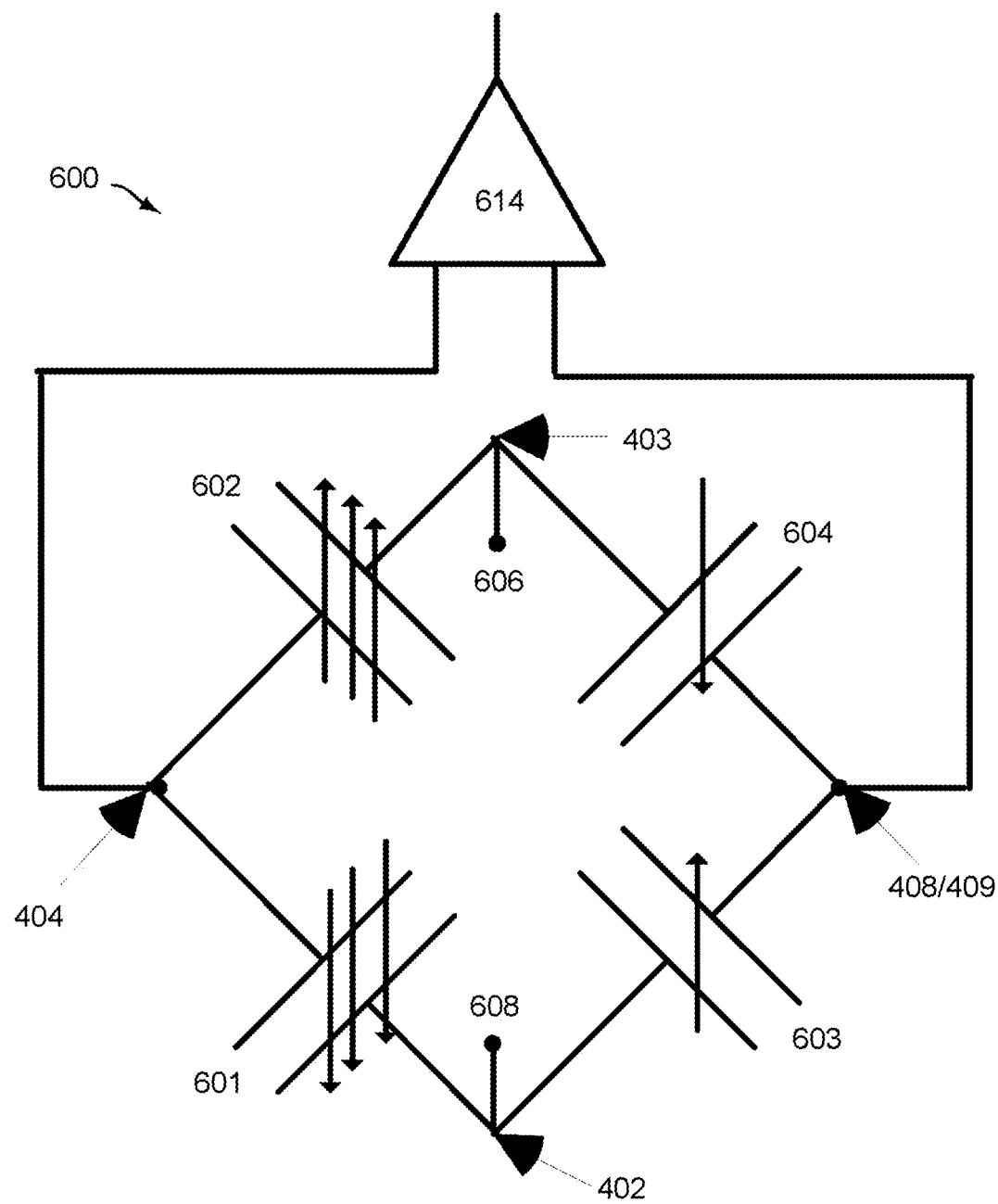
FIG. 6 shows another illustrative configuration of a proof mass bridge in accordance with some embodiments of the present disclosure.

FIG. 6 shows another illustrative configuration of a proof mass bridge in accordance with some embodiments of the present disclosure. Although a proof mass bridge may be implemented with any suitable MEMS sensor, in the exemplary embodiment of FIG. 6 the proof mass bridge 600 may be a Full Wheatstone bridge and may be implemented with the exemplary MEMS linear accelerometer of FIG. 4. In an exemplary embodiment, proof mass bridge 600 includes first capacitor 601 (e.g., based on the capacitance between proof mass 404 and electrode 402), second capacitor 602 (e.g., based on the capacitance between proof mass 404 and electrode 403), third capacitor 603 (e.g., based on the capacitance between proof mass 408 and electrode 402), fourth capacitor 604 (e.g., based on the capacitance between proof mass 409 and electrode 403), drive source 606, drive source 608, and C2V converter 614.

In one embodiment, drive source 608 provides a first drive signal (e.g., having a first potential) to electrode 602 and drive source 606 provides a second drive signal (e.g., having a second potential) to electrode 403. Proof mass 404 functions as a first output node of the Full Wheatstone bridge (e.g., via springs 411 and anchors 410a and 410b) and has an overall capacitance that is based on both first capacitor 601 (e.g., due to any out-of-plane misalignment of the MEMS plane and also due to movement of proof mass 404 due to a measured linear acceleration) and second capacitor 602 (e.g., due to any out-of-plane misalignment of the MEMS plane and also due to movement of proof mass 404 due to a measured linear acceleration). Proof masses 408 and 409 function as a second output node of the Full Wheatstone bridge (e.g., via beams 407 and anchor 406) functions as a second output node of the Full Wheatstone bridge and has an overall capacitance that is based on both third capacitor 603 (e.g., due to any out-of-plane misalignment of the MEMS plane and without substantial movement due to a measured linear acceleration) and fourth capacitor 604 (e.g., due to any out-of-plane misalignment of the MEMS plane and without substantial movement due to a measured linear acceleration). The capacitances from proof masses 404 and 408/409 are provided to differential inputs of C2V converter 614, which outputs a signal that is representative of the measured linear acceleration, with compensation for any out-of-plane misalignment of the MEMS layer provided based on the proof masses 408 and 409.

FIG. 6 depicts an exemplary positive z-axis acceleration with an out-of-plane misalignment of the MEMS layer that causes the MEMS layer to move closer to electrode 402 and farther from 403 (e.g., as compared to a MEMS layer that is parallel to the substrate). The positive z-axis acceleration causes the proof mass 404 to rotate such that the proof mass 404 moves closer to electrode 403 and farther from electrode 402. The out-of-plane misalignment causes proof mass 408 to be situated closer than parallel with electrode 402 and causes proof mass 409 to be situated farther than parallel with electrode 403.

Figure 7:
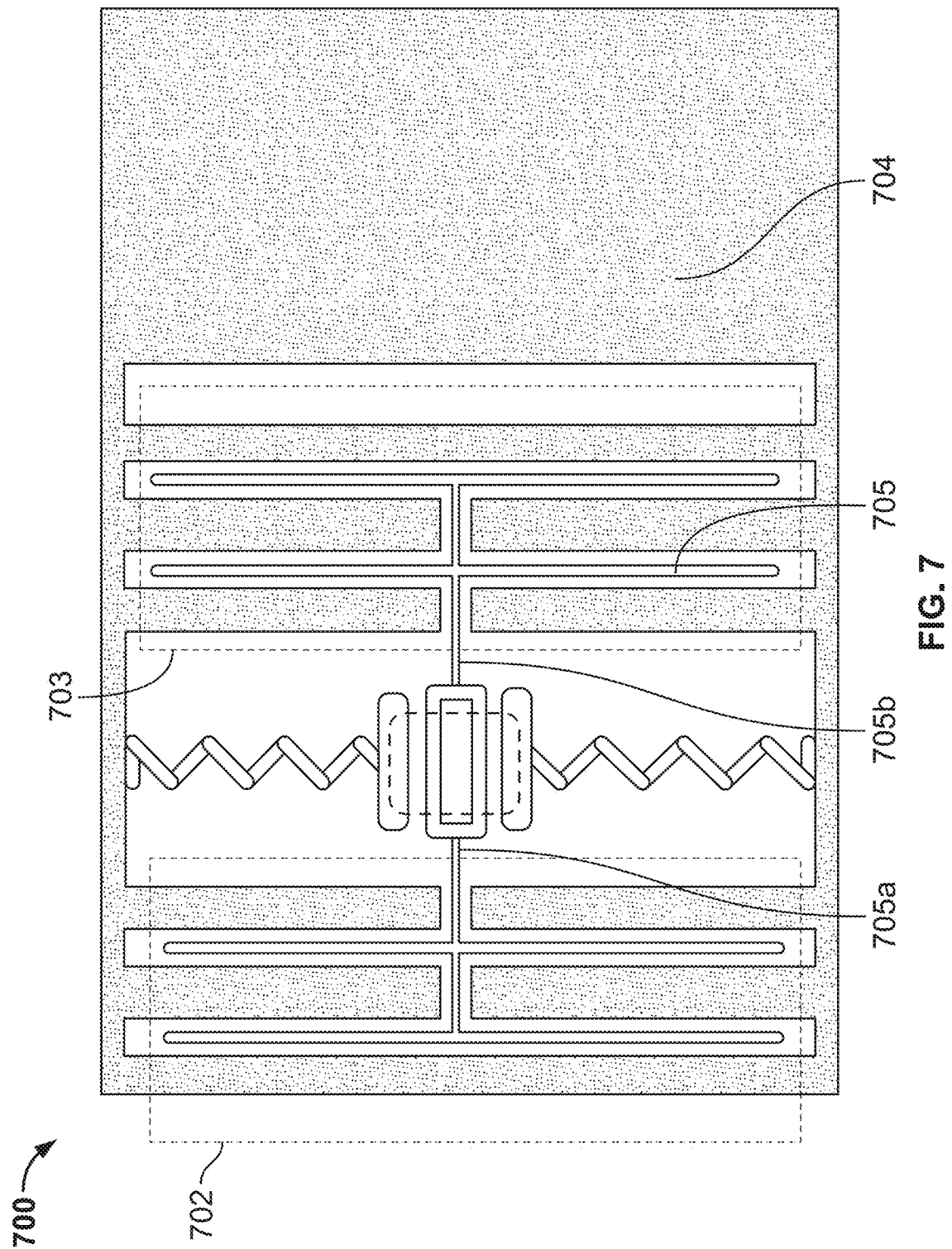
FIG. 7 depicts proof masses having an interdigitated pattern in accordance with some embodiments of the present disclosure.

FIG. 7 depicts proof masses having an interdigitated pattern in accordance with some embodiments of the present disclosure. In the exemplary embodiments of the present disclosure the substrate electrodes (e.g., electrodes 402 and 403) may be larger in at least one direction (e.g., along the x-axis in FIG. 4), such that in the event of misalignment within the x-y plane (e.g., within certain tolerances) the relative portions of each of the proof masses overlapping each of the electrodes may be substantially the same as without misalignment.

Under certain package loadings shearing can cause the structure to rotate relative to the substrate as shown in FIG. 2. Under bending loads the substrate and cap can bend causing complex curvatures on the electrodes. Both bending and shearing loads can occur simultaneously creating different gaps over the sensing electrodes and elements. The shape of the proof masses over the electrodes can be designed to minimize the relative gap differences on the four sensing elements that unknown and complex curves can cause. In some embodiments, this relative sizing and ability to account for curvatures may enable the creation of complex patterns for the proof masses and tighter tolerances for gaps between the proof masses. More complex patterns (e.g., a variety and combination of geometric shapes and/or fractal patterns), may enable designs that mitigate common problems that occur during MEMS manufacturing, assembly and use, such as substrate curvature. Non-limiting examples of such patterns are depicted in the examples of FIGS. 7, 8, and 9.

In the exemplary embodiment of FIG. 7, an exemplary MEMS sensor 700 may be similar to MEMS sensor 400, and may include a first substrate electrode 702, a second substrate electrode 703, a first proof mass system 704, and a second proof mass system 705. In the embodiment of FIG. 7 the first proof mass system 704 and the second proof mass system 705 are etched such that the proof masses of the second proof mass system 705 are interdigitated within and substantially surrounded by the first proof mass system 704. Although a particular number of interdigitated fingers and relative sizes and shapes are depicted in FIG. 7, it will be understood that a variety of configurations may be possible depending on available processing and manufacturing techniques, and desired functionality. Although the second proof mass system 705 is depicted as being patterned and substantially surrounded by the first proof mass system 704, it will be understood that both proof mass systems or the first proof mass system 704 may be patterned, and that any suitable portion of either proof mass system maybe surrounded by the other proof mass system. In the exemplary embodiment of FIG. 7, the overlap of the first proof mass system 704 with the electrodes 702 and 703 may be at least twice as large as the overlap of the second proof mass system 705 with the electrodes 702 and 703, while in other embodiments the relative overlap may be greater or lesser (e.g., an order of magnitude).

The first proof mass system may be configured to sense a linear acceleration (e.g., z-axis linear acceleration) based on out-of-plane movement of the first proof mass system 704 (e.g., about springs of first proof mass system 704). The second proof mass system 705 may be designed to remain substantially stationary in response to the sensed linear acceleration and the distance to the substrate electrodes may be indicative of out-of-plane misalignment between the MEMS layer and the substrate layer. In the exemplary embodiment of FIG. 7, a portion of first proof mass system 704 forms a first capacitor with first electrode 702, a portion of first proof mass system 704 forms a second capacitor with second electrode 703, a portion of second proof mass system 704 forms a third capacitor with first electrode 702, and a portion of second proof mass system 705 forms a fourth capacitor with second electrode 705. The four capacitors may be driven and coupled to a C2V converter in a bridge pattern (e.g., a Full Wheatstone bridge), for example, as depicted in FIGS. 5 and 6.

Figure 8:
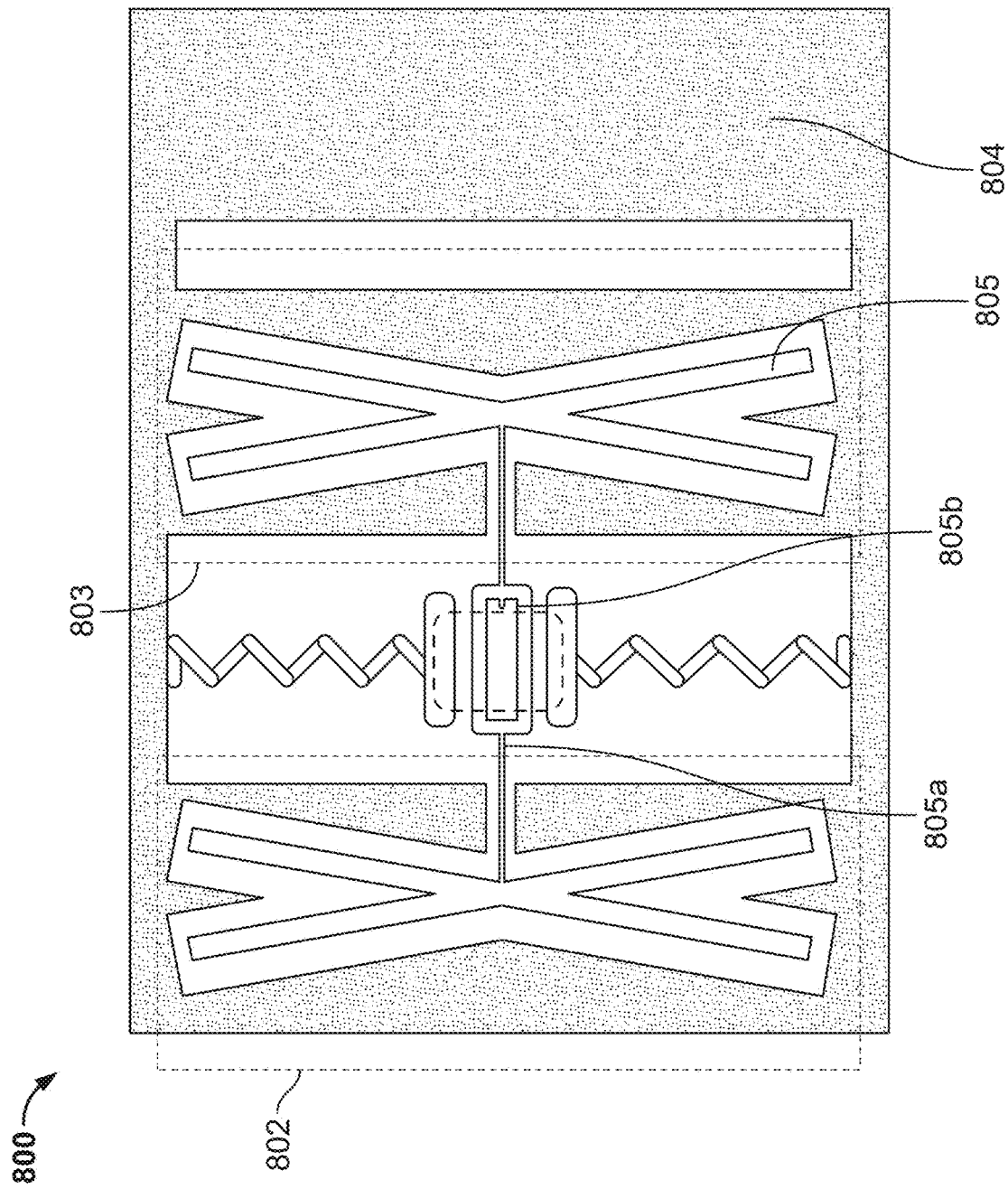
FIG. 8 depicts proof masses having a star pattern in accordance with some embodiments of the present disclosure.
Figure 9:
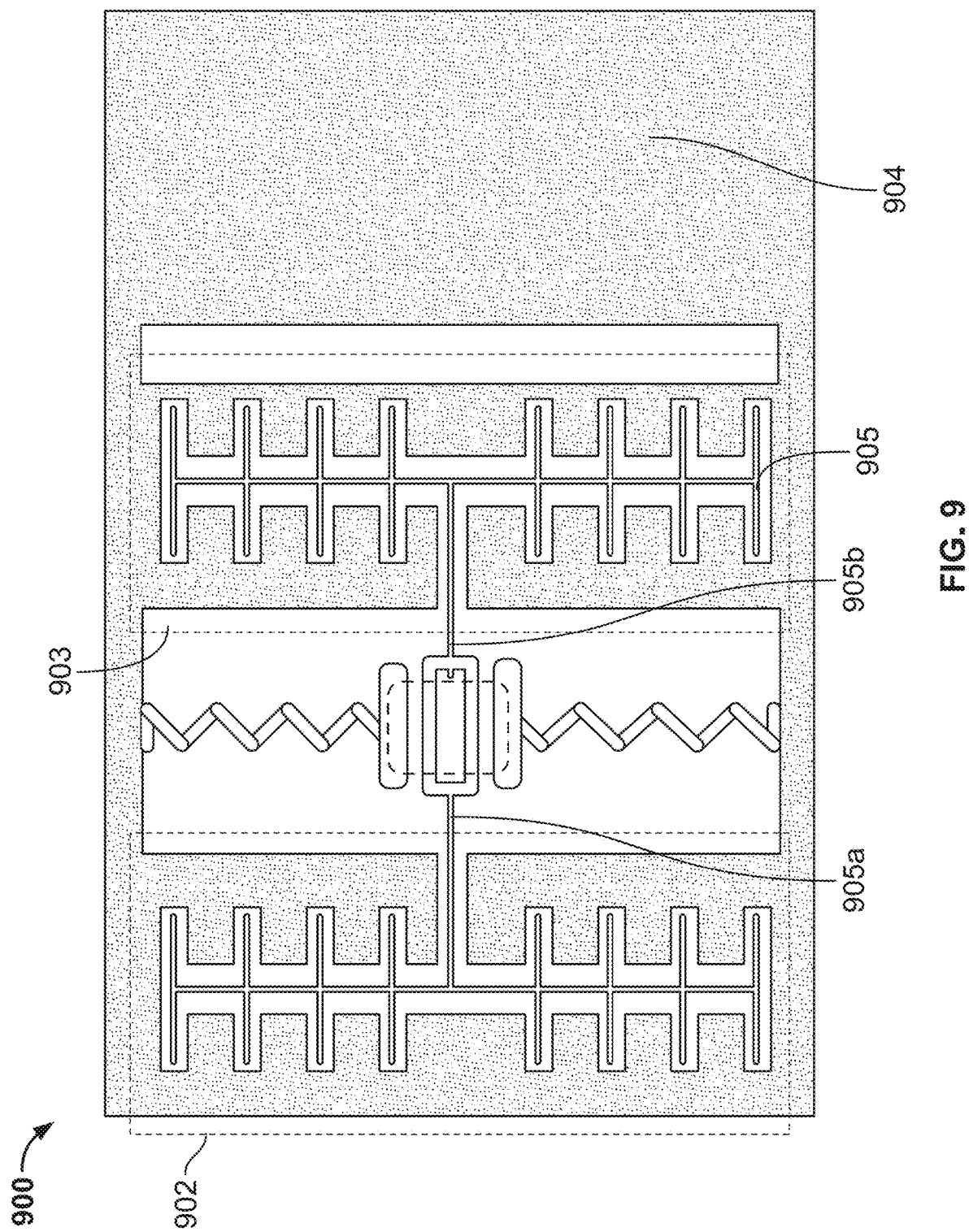
FIG. 9 depicts proof masses having an interdigitated fractal pattern in accordance with some embodiments of the present disclosure.

FIG. 8 depicts proof masses having a star pattern in accordance with some embodiments of the present disclosure. In the exemplary embodiment of FIG. 8, an exemplary MEMS sensor 800 may be similar to MEMS sensor 400, and may include a first substrate electrode 802, a second substrate electrode 803, a first proof mass system 804, and a second proof mass system 805. In the embodiment of FIG. 8 the first proof mass system 804 and the second proof mass system 805 are etched such that the proof masses of the second proof mass system 805 are interdigitated in a star pattern within and substantially surrounded by the first proof mass system 804. Although a particular star pattern (e.g., four fingers at particular angles and having generally rectangular shapes) is depicted in FIG. 8, it will be understood that a variety of configurations may be possible depending on available processing and manufacturing techniques, and desired functionality. Although the second proof mass system 805 is depicted as being patterned and substantially surrounded by the first proof mass system 804, it will be understood that both proof mass systems or the first proof mass system 804 may be patterned, and that any suitable portion of either proof mass system maybe surrounded by the other proof mass system. In the exemplary embodiment of FIG. 8, the overlap of the first proof mass system 804 with the electrodes 802 and 803 may be at least twice as large as the overlap of the second proof mass system 805 with the electrodes 802 and 803, while in other embodiments the relative overlap may be greater or lesser (e.g., an order of magnitude).

The first proof mass system 804 may be configured to sense a linear acceleration (e.g., z-axis linear acceleration) based on out-of-plane movement of the first proof mass system 804 (e.g., about springs of first proof mass system 804). The second proof mass system 805 may be designed to remain substantially stationary in response to the sensed linear acceleration and the distance to the substrate electrodes may be indicative of out-of-plane misalignment between the MEMS layer and the substrate layer. In the exemplary embodiment of FIG. 8, a portion of first proof mass system 804 forms a first capacitor with first electrode 802, a portion of first proof mass system 804 forms a second capacitor with second electrode 803, a portion of second proof mass system 805 forms a third capacitor with first electrode 802, and a portion of second proof mass system 805 forms a fourth capacitor with second electrode 803. The four capacitors may be driven and coupled to a C2V converter in a bridge pattern (e.g., a Full Wheatstone bridge), for example, as depicted in FIGS. 5 and 6.

FIG. 9 depicts proof masses having a fractal comb pattern in accordance with some embodiments of the present disclosure. In the exemplary embodiment of FIG. 9, an exemplary MEMS sensor 900 may be similar to MEMS sensor 400, and may include a first substrate electrode 902, a second substrate electrode 903, a first proof mass system 904, and a second proof mass system 905. In the embodiment of FIG. 9 the first proof mass system 904 and the second proof mass system 905 are etched such that the proof masses of the second proof mass system 905 are interdigitated in a comb tooth pattern within and substantially surrounded by the first proof mass system 904. Although a particular comb pattern, comb sizes, orientation, and number of comb fingers are depicted in FIG. 9, it will be understood that a variety of configurations may be possible depending on available processing and manufacturing techniques, and desired functionality. Although the second proof mass system 905 is depicted as being patterned and substantially surrounded by the first proof mass system 904, it will be understood that both proof mass systems or the first proof mass system 904 may be patterned, and that any suitable portion of either proof mass system maybe surrounded by the other proof mass system. In the exemplary embodiment of FIG. 9, the overlap of the first proof mass system 904 with the electrodes 902 and 903 may be at least twice as large as the overlap of the second proof mass system 905 with the electrodes 902 and 903, while in other embodiments the relative overlap may be greater or lesser (e.g., an order of magnitude).

The first proof mass system 904 may be configured to sense a linear acceleration (e.g., z-axis linear acceleration) based on out-of-plane movement of the first proof mass system 904 (e.g., about springs of first proof mass system 804). The second proof mass system 905 may be designed to remain substantially stationary in response to the sensed linear acceleration and the distance to the substrate electrodes may be indicative of out-of-plane misalignment between the MEMS layer and the substrate layer. In the exemplary embodiment of FIG. 9, a portion of first proof mass system 904 forms a first capacitor with first electrode 902, a portion of first proof mass system 904 forms a second capacitor with second electrode 903, a portion of second proof mass system 905 forms a third capacitor with first electrode 902, and a portion of second proof mass system 905 forms a fourth capacitor with second electrode 903. The four capacitors may be driven and coupled to a C2V converter in a bridge pattern (e.g., a Full Wheatstone bridge), for example, as depicted in FIGS. 5 and 6.

Figure 10:
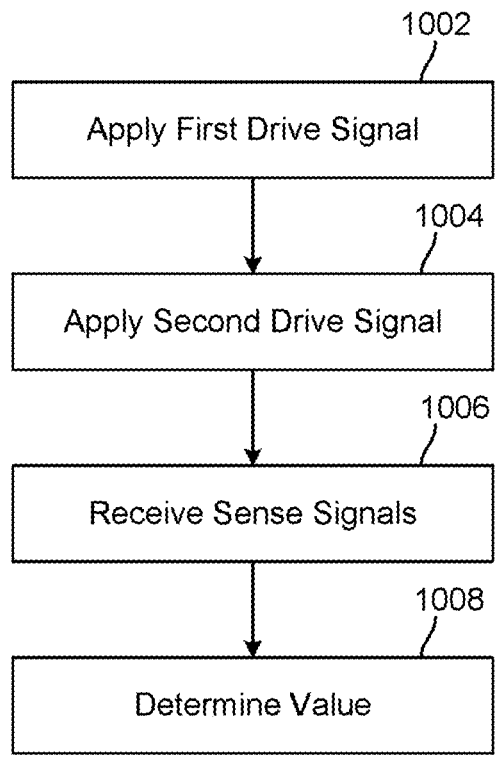
FIG. 10 depicts exemplary steps for offset compensation in accordance with some embodiments of the present disclosure.

FIG. 10 depicts exemplary steps for offset compensation according to some embodiments of the present disclosure. Although FIG. 10 is described in the context of the present disclosure and the exemplary MEMS accelerometer described herein, it will be understood that the methods and steps described in FIG. 10 may be applied to a variety of sensor types. Although a particular order and flow of steps is depicted in FIG. 10 it will be understood that in some embodiments one or more of the steps may be modified, moved, removed, or added, and that the flow depicted in FIG. 10 may be modified.

FIG. 10 depicts exemplary steps for determining a measured parameter (e.g., z-axis linear acceleration) utilizing overlapping proof masses and electrodes (e.g., multiple proof mass systems overlapping multiple electrodes, e.g., as described herein) based on relative movements of the proof masses (e.g., based on one proof mass system moving out-of-plane relative to substrate electrodes in response to a linear acceleration and the other proof mass system having a relative position to the substrate electrodes based on out-of-plane MEMS layer misalignment).

At step 1002, a first drive signal may be applied to a first proof mass system or a first electrode. The first drive signal may have a first potential. The first proof mass system or first electrode that receives the drive signal may function as a first input node of a sensing circuit such as a bridge circuit (e.g., a Full Wheatstone bridge). Once the first drive signal is applied to the first proof mass or the first electrode, processing may continue to step 1004.

At step 1004, a second drive signal may be applied to a second proof mass system or a second electrode. The second drive signal may have a second potential, and in some embodiments, the second potential and the first potential may be different. In an exemplary embodiment, the first proof mass may be electrically separate from the second proof mass (e.g., permanently or selectively, within the MEMS sensor as a whole or within the MEMS layer) and/or the first electrode may be electrically separate from the second proof mass. In an embodiment, if the first proof mass receives the first drive signal the second proof mass receives the second drive signal, and if the first electrode receives the first drive signal the second electrode receives the second drive signal. The second proof mass system or second electrode that receives the second drive signal may function as a second input node of a sensing circuit such as a bridge circuit (e.g., a Full Wheatstone bridge). Once the second drive signal is applied to the second proof mass or the second electrode, processing may continue to step 1004.

At step 1006, sense signals may be received from a plurality of capacitors. The proof masses may form capacitors with the electrodes, for example, a first capacitor formed between the first proof mass and the first electrode, a second capacitor formed between the first proof mass and the second electrode, a third capacitor formed between the second proof mass and the first electrode, and a fourth capacitor formed between the second proof mass and the second electrode. The capacitances and/or changes thereof may represent different phenomena, for example, with the first capacitor and second capacitor sensing an out-of-plane movement of the first proof mass system in response to a sensed linear acceleration and the third capacitor and fourth capacitor sensing an out-of-plane misalignment of the MEMS layer relative to the substrate layer based on the location of the second proof mass system. In embodiments, the relative sizing, positioning and shapes of the first proof mass system and second proof mass system may be configured to proportionally compensate for MEMS layer misalignment and to reject effects due to common manufacturing, assembly and wear conditions. In an embodiment, if the first proof mass system and the second proof mass system receive the drive signals, the first electrode and second electrode receive the sense signals. If the first electrode and the second electrode receive the drive signals, the first proof mass system and second proof mass system receive the sense signals. The first proof mass system or first electrode that receives the first sense signal may function as a first output node of a sensing circuit such as a bridge circuit (e.g., a Full Wheatstone bridge) and a second proof mass system or second electrode that receives the second sense signal may function as a second output node of the sensing circuit. Processing may then continue to step 1008.

At step 1008, the value to be measured (e.g., z-axis linear acceleration) may be determined based on the sense signals received at step 1006. The sense signals may be provided to a component (e.g., a C2V converter) that generates an output signal (e.g., a voltage or current) that is based on the relative position of the proof masses relative to the electrodes (e.g., based on capacitance values within the Full Wheatstone bridge). The measured signal may be processed in a variety of manners such as scaling (e.g., based on known associations between the output signal and the parameter being measured), amplification, filtering (e.g., to remove known or measured error or interference signals and/or harmonics thereof), and compensation (e.g., based on other measured signals from the MEMS system, based on individual measurements from the electrodes or proof mass systems, based on other measured parameters such as environmental conditions, and other signal sources such as from other systems of an assembled system). Once the measured value is determined, the processing of FIG. 10 may end.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical (MEMS) sensor, comprising:
 a substrate;
 a first electrode located on the substrate;
 an anchor coupled to the substrate;
 a first proof mass located within a MEMS layer and coupled to the anchor;
 a second proof mass located within the MEMS layer and coupled to the anchor, wherein the first and second proof masses are electrically separate within the MEMS layer, wherein the first proof mass and the second proof mass have different potentials, and wherein the first electrode is positioned between the first proof mass and an upper planar surface of the substrate;
 a first sense element coupled to the first proof mass and the first electrode; and
 a second sense element coupled to the second proof mass and the first electrode.

2. The MEMS sensor of claim 1, wherein the first proof mass moves in a first direction in response to a first external force and the first sense element outputs a first sense signal in response to motion of the first proof mass along the first direction.

3. The MEMS sensor of claim 2, wherein the second proof mass moves in a second direction in response to a second external force and the second sense element outputs a second sense signal in response to motion of the second proof mass in the second direction.

4. The MEMS sensor of claim 3, further comprising processing circuitry coupled to the first sense element and the second sense element to output a measured signal that corresponds to the first external force based on the first sense signal and the second sense signal.

5. The MEMS sensor of claim 4, wherein the motion of the second proof mass in the second direction in response to the second force generates substantially zero output signal.

6. The MEMS sensor of claim 3, wherein the first external force comprises acceleration, magnetic field, acoustic pressure, barometric ambient pressure, or Coriolis force.

7. The MEMS sensor of claim 5, wherein the second external force comprises thermal expansion, fabrication loading, shock, impact, soldering, or hygroscopic swelling.

8. The MEMS sensor of claim 3, wherein the first direction and the second direction are substantially perpendicular to the substrate.

9. The MEMS sensor of claim 1, wherein the first sense element and the second sense element comprise a variable capacitor, a piezo-resistive sensor, a piezo-electrical sensor, an optical sensor, or a magnetic sensor.

10. The MEMS sensor of claim 1, wherein the second proof mass comprises a paddle body coupled to the anchor via a paddle extension, wherein the paddle body is surrounded by the first proof mass on at least three sides.

11. The MEMS sensor of claim 10, wherein the paddle body and the first proof mass comprise a comb structure.

12. The MEMS sensor of claim 10, wherein the paddle body and the first proof mass comprise an interdigitated star structure.

13. The MEMS sensor of claim 10, wherein the paddle body and the first proof mass comprise an interdigitated fractal structure.

14. The MEMS sensor of claim 1, further comprising:
a second electrode located on the substrate layer, wherein the second electrode is positioned between the second proof mass and the upper planar surface of the substrate;
a third sense element coupled to the first proof mass and the second electrode; and
a fourth sense element coupled to the second proof mass and the second electrode.

15. The MEMS sensor of claim 14, further comprising processing circuitry coupled to the first sense element, the second sense element, the third sense element, and the fourth sense element to output a measured signal that corresponds to a first external force.

16. The MEMS sensor of claim 15, wherein each of the first sense element, the second sense element, the third sense element, and the fourth sense element comprise variable capacitors and the processing circuitry comprises a capacitive Wheatstone bridge and a charge-to-voltage amplifier.

17. The MEMS sensor of claim 16, wherein the first electrode is coupled to a first terminal of the charge-to-voltage amplifier, the second electrode is coupled to a second terminal of the charge-to-voltage amplifier, the first proof mass is driven with a first voltage, and the second proof mass is driven with a second voltage.

18. The MEMS sensor of claim 17, wherein a capacitance associated with the first proof mass and the first electrode corresponds to a first capacitor of the capacitive Wheatstone bridge, a capacitance associated with the second proof mass and the first electrode corresponds to a second capacitor of the capacitive Wheatstone bridge, a capacitance associated with the first proof mass and the second electrode corresponds to a third capacitor of the capacitive Wheatstone bridge, and a capacitance associated with the second proof mass and the second electrode corresponds to a fourth capacitor of the capacitive Wheatstone bridge.

19. The MEMS device of claim 14, wherein the first proof mass moves in a first direction in response to a first external force and the first sense element outputs a first sense signal in response to motion of the first proof mass in the first direction, wherein the second proof mass moves in a second direction in response to a second external force and the second sense element outputs a second sense signal in response to motion of the second proof mass in the second direction, wherein the third sense element outputs a third sense signal in response to the motion of the first proof mass in the first direction, and wherein the fourth sense element outputs a fourth sense signal in response to the motion of the second proof mass in the second direction.

20. The MEMS device of claim 14, wherein the first sense element and third sense element comprise a first differential pair, and the second sense element and the fourth sense element comprise a second differential pair.

21. The MEMS device of claim 1, further comprising a cap wherein the cap is coupled to the substrate and forms a cavity and wherein the anchor is coupled to the substrate via the cap.

22. A method for operating a microelectromechanical (MEMS) sensor, comprising:
receiving, from a first sense element coupled to a first proof mass and a first electrode, a first sense signal, wherein the first electrode is located on a substrate, an anchor is coupled to the substrate, and the first proof mass is directly coupled to the anchor, and wherein the first electrode is positioned between the first proof mass and an upper planar surface of the substrate;
receiving, from a second sense element coupled to a second proof mass and the first electrode, a second sense signal, wherein the second proof mass is coupled to the anchor, wherein the first proof mass and the second proof mass are located within a MEMS layer, wherein the first and second proof masses are electrically separate, and wherein the first proof mass and the second proof mass have different potentials; and
determining, by processing circuitry coupled to the first sense element and the second sense element, a measured signal that corresponds to a first external force based on the first sense signal and the second sense signal.

23. A microelectromechanical (MEMS) sensor, comprising:
a first electrode having a first electrode plane;
an anchor coupled to a substrate;
a first proof mass within a MEMS layer and having a first proof mass plane that overlaps at least a portion of the first electrode plane, wherein the first proof mass is coupled to the anchor, and wherein the first electrode is positioned between the first proof mass and an upper planar surface of the substrate;
a second proof mass within the MEMS layer and having a second proof mass plane that overlaps at least a portion of the first electrode plane, and wherein the first proof mass and the second proof mass are not electrically coupled within the MEMS layer, wherein the first proof mass and the second proof mass have different potentials, and wherein the second proof mass is coupled to the anchor; and
processing circuitry coupled to the first electrode, the first proof mass, and the second proof mass, wherein the first proof mass moves in a first direction relative to the first electrode in response to a first external force, wherein the second proof mass is substantially stationary in response to the first external force, and wherein a signal that corresponds to the first external force is based on a first position of the first proof mass relative to the first electrode and the second position of the second proof mass relative to the first electrode.

* * * * *